United States Patent
Keithley (10) Patent No.: US 7,424,120 B2
(45) Date of Patent: Sep. 9, 2008

(54) METHOD AND APPARATUS FOR VOLUME CONTROL

(75) Inventor: Douglas Gene Keithley, Boise, ID (US)

(73) Assignee: Avago Technologies General IP Pte Ltd, Singapore (SG)

( * ) Notice: Subject to any disclaimer, the term of this patent is extended or adjusted under 35 U.S.C. 154(b) by 726 days.

(21) Appl. No.: 10/635,073

(22) Filed: Aug. 6, 2003

(65) Prior Publication Data

US 2005/0031142 A1    Feb. 10, 2005

(51) Int. Cl.
- *H03G 3/00* (2006.01)
- *H03G 9/00* (2006.01)
- *H03F 3/38* (2006.01)
- *H03K 3/00* (2006.01)
- *H04B 1/20* (2006.01)

(52) U.S. Cl. .................. 381/107; 381/102; 381/104; 330/10; 330/284; 327/291; 340/825.25

(58) Field of Classification Search .................. 381/104, 381/109, 107, 102, 103; 340/392.3, 825.25; 379/375.01, 418; 330/10, 284; 700/94; 327/172, 327/179, 291

See application file for complete search history.

(56) References Cited

U.S. PATENT DOCUMENTS

| | | | |
|---|---|---|---|
| 3,796,831 A | | 3/1974 | Bauer |
| 3,932,849 A | * | 1/1976 | Welch ..................... 340/586 |
| 4,303,998 A | * | 12/1981 | Plunkett, Jr. ............. 369/29.01 |
| 4,414,877 A | | 11/1983 | Scott, Jr. |
| 4,724,493 A | * | 2/1988 | Nakamura ................... 360/51 |
| 4,805,199 A | | 2/1989 | Muramatsu |
| 4,924,511 A | * | 5/1990 | Burns et al. ................. 379/418 |
| 5,010,306 A | * | 4/1991 | Kutzavitch et al. ......... 330/284 |
| 5,165,017 A | * | 11/1992 | Eddington et al. ......... 381/321 |
| 5,189,705 A | * | 2/1993 | Lavaud ...................... 381/104 |

(Continued)

FOREIGN PATENT DOCUMENTS

EP    0 781 071 A1    6/1997

(Continued)

OTHER PUBLICATIONS

Yasmin Wilson, Search Report Under Section 17, Oct. 27, 2004, Application No. GB0415982.8.

(Continued)

*Primary Examiner*—Vivian Chin
*Assistant Examiner*—Devona E Faulk (57) ABSTRACT

A method and apparatus for generating and controlling volume of a speaker of an appliance is disclosed. The appliance includes an IC chip connected to an amplifier subsystem. The IC chip includes a square-wave audio signal generator, a counter, a register, a comparator, and an AND gate. Theses components of the IC chip are used to generate modulated audio frequency square-wave signal. The modulated audio frequency square-wave signal having pulses, each pulse has a width determined by the volume control value. The modulated audio frequency square-wave signal is sent from the IC chip to the amplifier subsystem on a single connection. At the amplifier subsystem, the modulated audio frequency square-wave signal is integrated over, filtered, and amplified to drive a speaker to produce the desired sound. By adjusting the volume control value, the widths of the pulses, thus the volume of the produced sound can be controlled.

17 Claims, 5 Drawing Sheets

U.S. PATENT DOCUMENTS

| | | | |
|---|---|---|---|
| 5,596,651 A * | 1/1997 | Yamaguchi | 381/104 |
| 6,016,075 A | 1/2000 | Hamo | |
| 6,400,821 B1 * | 6/2002 | Burgan et al. | 379/361 |
| 6,944,284 B2 * | 9/2005 | Goodings | 379/373.02 |
| 2002/0048193 A1 * | 4/2002 | Tanikawa et al. | 365/185.33 |

FOREIGN PATENT DOCUMENTS

| | | |
|---|---|---|
| FR | 2 435 169 | 3/1980 |
| GB | 2 256 775 A | 12/1992 |
| GB | 2343573 | 5/2000 |
| GB | 2343573 | 10/2000 |
| JP | 59-181897 | 10/1984 |

OTHER PUBLICATIONS

Stuart Jarvis, Search Report Under Section 17, Jun. 27, 2006, Application No. GB0609030.2.

Combined Search and Examination Report Under Section 17 and 18(3) for Divisional British Patent Application No. 0609030.2 dated Jun. 28, 2006.

* cited by examiner

METHOD AND APPARATUS FOR VOLUME CONTROL

BACKGROUND

The present invention relates to integrated circuit, and more particularly, to integrated circuits for controlling audio signals.

Some electronic appliances include sophisticated audio circuitry and speakers to generate music, voice, and other refined audio signals. However, for many other appliances, generation of such refined audio signals is not necessary. For example, printers, copiers, microwave heaters, and washing machines typically require little more than simple audio circuitry to generate rudimentary sounds such as beeps to alert its operators of certain conditions such as termination of operation or abnormal operations.

Figure 1A:
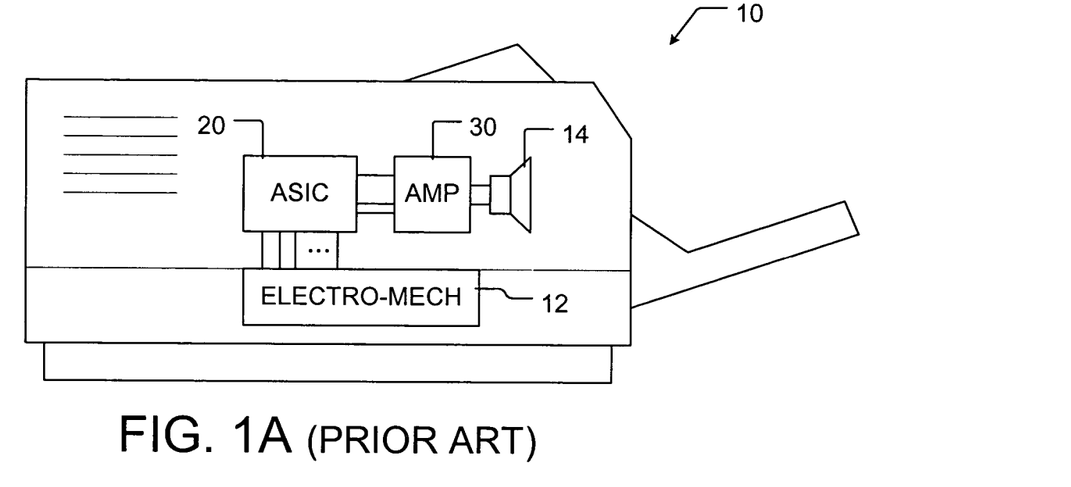
FIG. 1A is a simplified schematic view of a prior art apparatus.

FIG. 1A is a simplified schematic illustration of an appliance 10 (a printer, for example) configured to generate rudimentary sounds. In the Figures, relative sizes of various components, structures, or portions are exaggerated for illustrative purposes and, thus, are provided to illustrate the general structures and configurations of the subject of the Figures.

The appliance 10 includes various electro-mechanical components for performing its function (for printing in the present example). The electro-mechanical components are illustrated as a box 12 and can include, for the present example, rollers, heaters, laser, and sensors. Typically, the electro-mechanical components 12 are connected to and are controller by an integrated circuit chip (IC) 20. The IC 20 is often implemented using an Application-Specific Integrated Circuit (ASIC) chip that includes, within the single chip, a processor and memory. The ASIC 20 is a digital circuit chip programmed to control the operations of the appliance 10 including generations of sounds from a speaker 14.

Figure 1B:
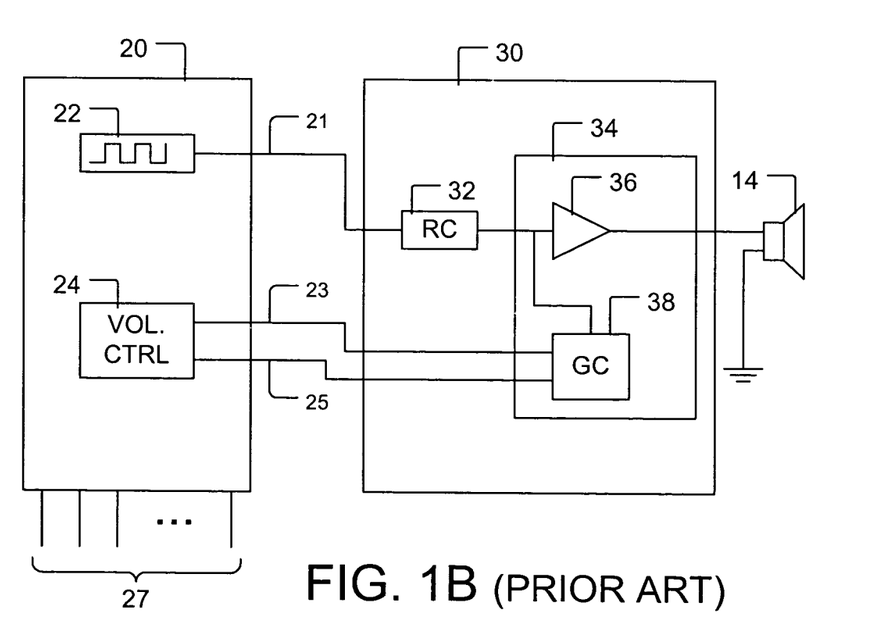
FIG. 1B is a more detailed view of portions of the prior art apparatus of FIG. 1A.

The speaker 14 is an analog device and it requires an analog audio frequency input signal for operation. Accordingly, an amplifier subsystem 30 is used to drive the speaker 14. The amplifier subsystem 30, is, in turn, controlled by inputs from the ASIC 20. This configuration is illustrated in more detail in FIG. 1B. FIG. 1B illustrates portions of the appliance 10 of FIG. 1A in greater detail. In the illustrated example, the ASIC 20 includes an audio square-wave signal generator 22 providing audio square-wave signals and a volume control circuit 24 providing volume control signals. The audio square-wave signals are sent to the amplifier subsystem 30 via a first pin 21 of the ASIC 20. The volume control signals, each a binary digit, are sent to the amplifier subsystem 30 via a second pin 23 and a third pin 25. The ASIC has additional pins 27 connecting to other parts of the appliance 10 including, for example, the electro-mechanical components 12. For clarity, only relevant parts of the ASIC 20 are illustrated or discussed herein.

The first pin 21 (carrying the audio frequency square-wave signals) is connected to a resistor-capacitor (RC) filter 32 portion of the amplifier subsystem 30. At the RC filter 32, the audio square-wave signals are filtered for reduction of harmonic frequency components. The filtered audio signal is then forwarded to a programmable gain amplifier 34 portion of the amplifier subsystem 30. The programmable gain amplifier 34 has two major parts—a fixed gain amplifier 36 and a gain control circuit 38 connected to the fixed gain amplifier 36.

The second pin 23 and the third pin 25 are connected to a programmable gain circuit of the programmable gain amplifier 34 which determines the level of gain, if any, the fixed gain amplifier 36 applies to the RC filtered audio signal. Finally, the amplified signal is sent to the speaker 14. Here, two binary signals of the volume control signals allow for four volume controls—one zero (off) volume, and three levels of on volume.

To provide additional levels of volume control, additional signal lines (thus pins of the ASIC) are needed. However, in some applications, additional pins may not be available. In fact, it would be desirable to reduce the number of pins required to drive an audio circuit.

Accordingly, there remains a need for a method and apparatus for controlling volume of an audio output while using reduced number of pins for volume control signals.

SUMMARY

The need is met by the present invention. According to a first embodiment of the present invention, an integrated circuit (IC) chip includes a square-wave audio signal generator, a counter, and a register. The square-wave audio signal generator is adapted to generate square-wave signals at audio frequencies. The counter is adapted to digitally count from zero to a predetermined number. The register is adapted to hold a volume control value. The IC chip further includes a comparator and an AND gate. The comparator is connected to the counter and also connected to the register. The comparator is adapted to compare the count with the volume control value and produce a modulation signal. The AND gate is connected to the square-wave audio signal generator and connected to said comparator. The AND gate is adapted to combine, in a logical AND operation, the audio frequency square-wave signal with the modulation signal.

In a second embodiment of the present invention, a method of generating modulated square-wave audio signal is disclosed. First, a square-wave audio signal having a first audio frequency is generated. Then, a predetermined range of values is repeated counted, thus generating count signals. Next, the count signal is modulated with a volume control signal resulting in modulation signals. Finally, the square-wave audio signal is modulated with the modulation signal.

In a third embodiment of the present invention, an apparatus is disclosed. The apparatus includes an integrated circuit (IC) chip adapted to generate a modulated audio frequency square-wave signals and an amplifier subsystem connected to the IC chip. The amplifier subsystem is adapted to filter the modulated square-wave audio signal and to amplify the filtered audio signal.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 5A through 7B illustrate signals at various points within an apparatus of FIGS. 2A and 2B under differing configurations of the apparatus.

DETAILED DESCRIPTION

The present invention will now be described with reference to FIGS. 2A through 6D, which illustrate various embodiments of the present invention. As illustrated in the Figures, relative sizes of various portions, structures, or any combination of these are exaggerated for illustrative purposes and, thus, are provided to illustrate the general structures of the present invention.

As shown in the Figures for the purposes of illustration, one embodiment of the present invention is exemplified by an apparatus, for example a printer. The apparatus includes an integrated circuit (IC) chip connected to an amplifier subsystem. Here, the IC is adapted to generate a modulated square-wave audio signal. The modulated square-wave audio signal is connected to the amplifier subsystem via only one pin. The modulation of the square-wave audio signal allows for the control of volume level of the audio signal. Accordingly, only one pin of the IC is needed to send the audio signal and the volume control signal to the amplifier subsystem. This is a reduction in the number of pins of the IC needed to deliver the audio signal and the volume control information compared to the prior art designs. The reduction in the number of required pins allows for use of less expensive IC chips.

Furthermore, an additional benefit is realized for the apparatus embodying the present invention. In the present invention, the modulation of the square-wave audio signal allows for the control of volume level of the audio signal; thus, separate volume control signals are not generated by the IC chip. For this reason, the amplifier subsystem of the present invention does not require the gain control circuit 38 of FIG. 1.

The reduction in the number of required pins of the IC chip and reduction in the components and functions of the amplifier subsystem lead to lower costs and increases in reliability of the apparatus.

Figure 2A:
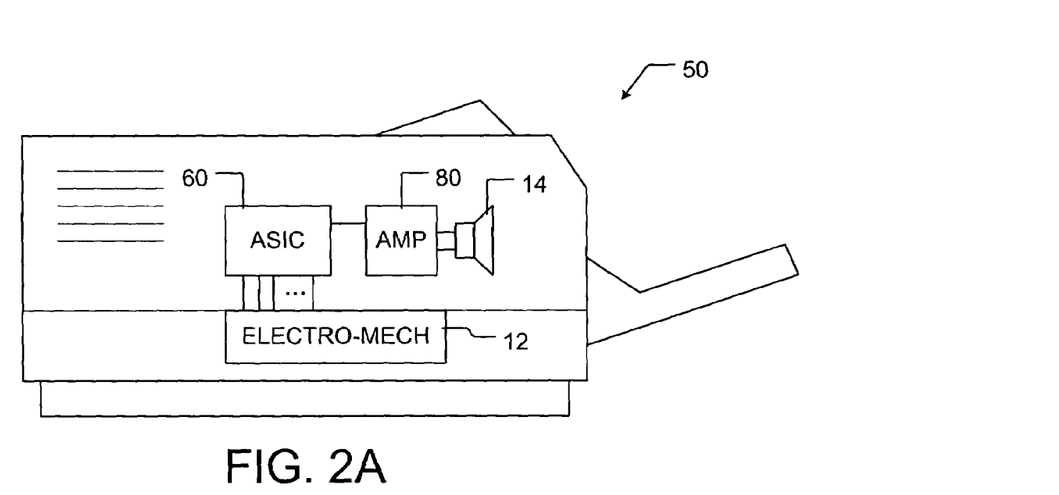
FIG. 2A is a simplified schematic view of an apparatus according to one embodiment of the present invention.
Figure 2B:
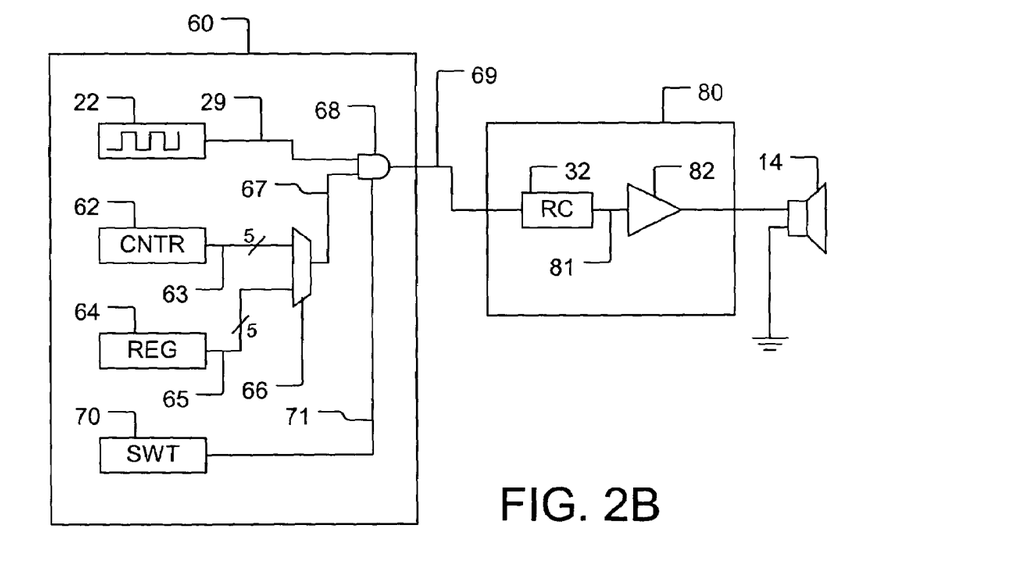
FIG. 2B is a more detailed view of portions of the apparatus of FIG. 2A.

FIG. 2A is a simplified schematic view of an apparatus 50 according to one embodiment of the present invention. FIG. 2B is a more detailed view of portions of the apparatus 50 of FIG. 2A. The apparatus 50 can be any type of electronic appliances such as, for example only, a printer, a copier, a microwave heater, or a washing machine. In the present example, the apparatus 50 can be a printer.

The printer 50 of FIGS. 2A and 2B includes components that are similar to corresponding components of the printer 10 of FIGS. 1A and 1B. For convenience, components in FIGS. 2A and 2B that are similar to corresponding components in FIGS. 1A and 1B are assigned the same reference numbers. Different components are assigned different reference numbers.

Referring to FIGS. 2A and 2B, the printer 50 includes an integrated circuit (IC) chip such as, for example, an Application-Specific Integrated Circuit (ASIC) 60. The ASIC 60 is adapted and configured to generate a modulated square-wave audio signal as discussed below. The ASIC 60 is connected to an amplifier subsystem 80 adapted to filter the modulated square-wave audio signal and to amplify the filtered audio signal.

Figure 3:
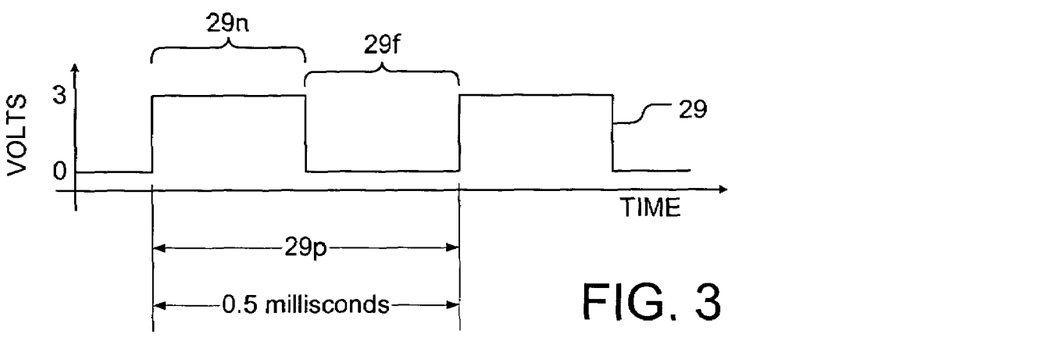
FIG. 3 is a sample audio frequency square-wave signal.

The ASIC 60 includes a square-wave audio signal generator 22 adapted to generate square-wave signals at audio frequencies. For example, the square-wave audio signal generator 22 can generate audio square-wave signals at two KHz. In general, the square-wave audio signal generator 22 can be configured to produce anywhere from 500 Hz to five KHz. FIG. 3 illustrates audio frequency square-wave signal 29 at two KHz. For convenience, the same reference number 29 is used to refer to output line 29 of the square-wave audio signal generator 22 as well as the audio frequency square-wave signal 29 carried by the square-wave audio signal generator output line 29. At two KHz, the period $29p$ of the audio frequency square-wave signal 29 is 0.5 milliseconds (ms). The audio frequency square-wave signal 29 of FIG. 3 and other digital signals in subsequent Figures are illustrated as having a first state (zero) at zero volts and a second state (one) at three volts. This is for example only, and the actual voltage values for digital signals vary widely depending on implementation.

The ASIC 60 includes a counter 62 adapted to digitally count from zero to a predetermined number. The predetermined number depends on the number of bits used to implement the counter 62. For example, if five-bit counter is used, then the counter 62 has 32 states (2 to $5^{th}$ power) and able to repeatedly count 32 numbers from zero to 31. The counter 62 operates at some frequency higher than the frequency of the audio square-wave signal 29. The counter 62 can operate at a counter frequency on the order of MHz, for example, one MHz. Operating at one MHz, then, the counter 62 continues to generate, at its output line 63, one in the sequence of numbers from zero to 31, one number every microsecond. The sequence repeats every 32 microseconds. The counter 34 has a fundamental frequency of 31.25 KHz. That is, the counter 62 cycles through the 32 numbers 31,250 times per second. This is above audio frequency.

The ASIC 60 includes a register 64 adapted to hold a volume control value. The size of the register 64 is typically the same as the size of the counter 62. In the present example, the register 64 can be five bits wide adaptable to hold any value between zero to 31 inclusive. The register 64 is often referred to as a pulse width register because its value determines width of a modulation signal as discussed further below. The register outputs volume control signal, or value, 65. The register 64 can be set to any one of the available values of the count 63.

The counter 62 and the register 64 are connected to a comparator 66. The comparator 66 is adapted to compare the count 63 with the volume control signal 65 and produce a modulation signal 67.

The comparator 66 can be configured to perform many different compare operations on the count 63 and the volume control value (VCV) 65. Some of the possible operations are, for example, compare for:

count 63<volume control value 65;
count 63<=volume control value 65;
count 63>volume control value 65;
count 63>=volume control value 65;

where
    <is less than;
    <=is less than or equal to;
    >is greater than; and
    >=is greater than or equal to.

For example, in one embodiment, the comparator 66 is configured to perform the count 63<volume control value 65 operation, and the volume control value 65 is set at eight. Then, as the counter 62 cycles through the numbers zero to 31, the comparator 66 compares the count 63 against the volume control value 65 of eight. When the count 65 is less than eight (that is when the count 63 is zero to seven), the modulation signal 67 is at a first binary value (for example, "on"). The modulation signal 67 is at a second binary value (for example, "off") when the count 63 is equal to or greater than eight. As already discussed above, the count 63 cycles every 32 microseconds (one microsecond per count) having a frequency of 31.25 KHz. Thus, the period of each count cycle is 32 microseconds in the present example of one MHz operation for the counter 62.

Figure 4A:
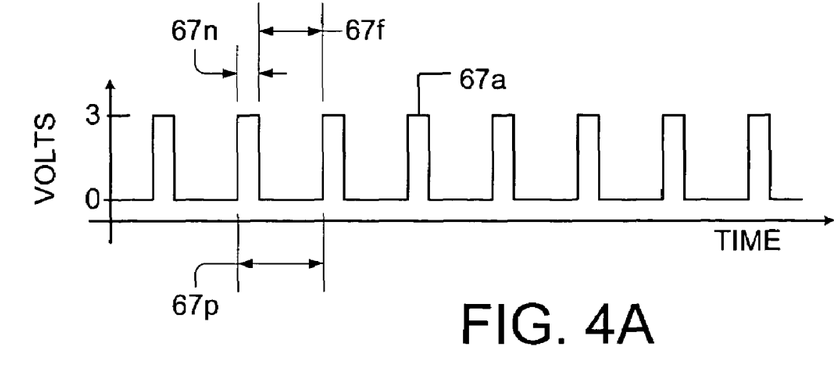
FIG. 4A through 4C illustrate possible modulation signals.

Since the count 63 is less than eight for eight counts (zero to seven) and greater than or equal to eight (eight to 32) for 24 counts, the modulation signal 67 is at the on-state (or is on "duty") for eight microseconds and is at the off-state (is off "duty") for 24 microseconds of each cycle of 32 microseconds. This is illustrated as a quarter-duty modulation signal 67a of FIG. 4A. Referring to FIG. 4A, each count cycle defines a modulation period 67p of 32 microseconds. As illustrated, the quarter-duty modulation signal 67a includes an on-duty portion 67n covering 25 percent of the modulation period 67p and an off-duty portion 67f covering 75 percent of the modulation period 67p. The on-duty portion 67n of each modulation period 67p is often referred to as a "pulse" 67n or the "pulse width". Further, the percentage of the pulse 67n compared to the modulation period 67p is often referred to as "duty cycle."

Figure 4B:
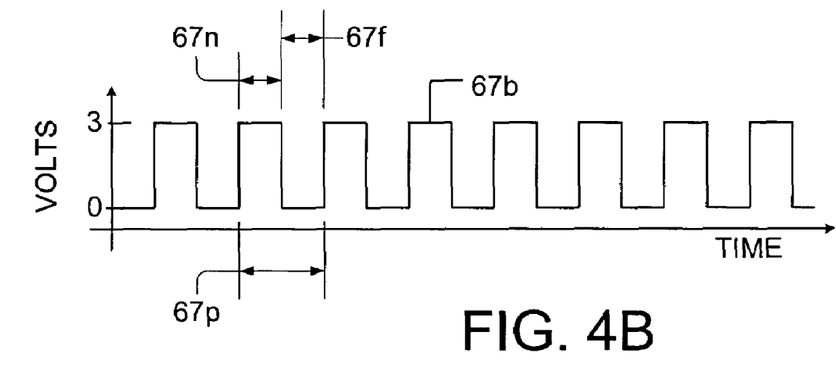

FIG. 4B illustrates a half-duty modulation signal 67b. If the comparator 66 is configured to perform the count 63<volume control value 65 operation, and the volume control value 65 is set at 16, then, as the counter 62 cycles through the numbers zero to 31, the comparator 66 compares the count 63 against the volume control value 65 of 16. When the count 65 is less than 16 (that is when the count 63 is zero to 15), the modulation signal 67 is on duty. The modulation signal 67 is off duty when the count 63 is equal to or greater than 15. As already discussed above, the count 63 cycles every 32 microseconds (one microsecond per count). The count 63 is less than 16 half of the modulation period 67p and equal to or greater than 16 the other half of the modulation period 67p. Thus, the modulation signal 67 would be on duty half the time and off duty half of the time for each modulation period 67p of 32 microseconds. This is illustrated as the half-duty modulation signal 67b. Referring to FIG. 4B, the half-duty modulation signal 67b has a 50 percent duty cycle.

Figure 4C:
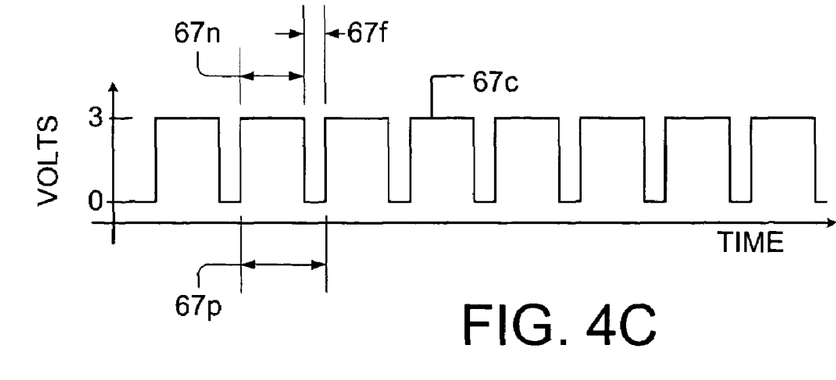

FIGS. 4C illustrates a three-quarter-duty modulation signal 67c. The three-quarter-duty modulation signal 67c is generated by configuring the comparator 66 to perform the count 63<volume control value 65 operation, and setting the volume control value 65 is set at 24. Then, as the counter 63 cycles through the numbers zero to 31, the comparator 66 compares the count 63 against the volume control value 65 of 24. When the count 65 is less than 24 (that is when the count 63 is zero to 23), the modulation signal 67 is on duty. The modulation signal 67 is off duty when the count 63 is equal to or greater than 24. As already discussed above, the count 63 cycles every 32 microseconds (one microsecond per count). The count 63 is less than 24 for 75 percent of the modulation period 67p and equal to or greater than 24 for 25 percent of the modulation period 67p. Thus, the modulation signal would be on duty 75 percent the time and off duty 25 percent of the time for each modulation period 67p of 32 microseconds. This is illustrated as the three-quarter-duty modulation signal 67c. Referring to FIG. 4C, the three-quarter-duty modulation signal 67c has a 75 percent duty cycle.

Only three levels of duty are illustrated in FIGS. 4A through 4C; however, it is apparent that, using the five-bit counter 62 and a five-bit register 64, the duty-level of the modulation signal 67 can be set at 32 different levels depending on the possible values of the register 64. The modulation signal 67 is the count signal from the counter 62 modulated by the volume control signal 65 from the register 64. The modulation signal 67 is the modulated count signal.

Figure 5A:
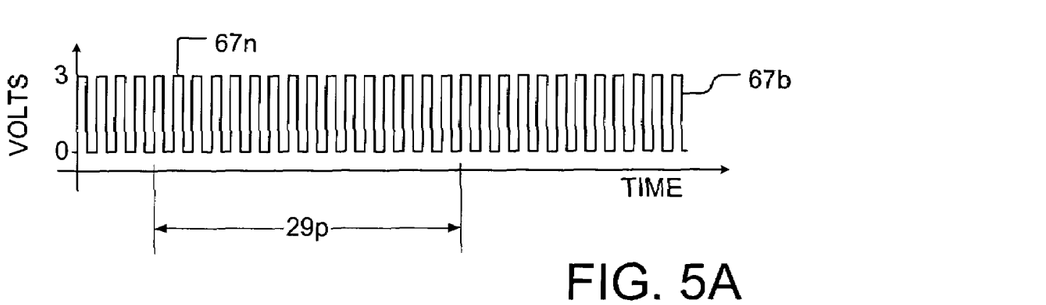
Figure 5B:
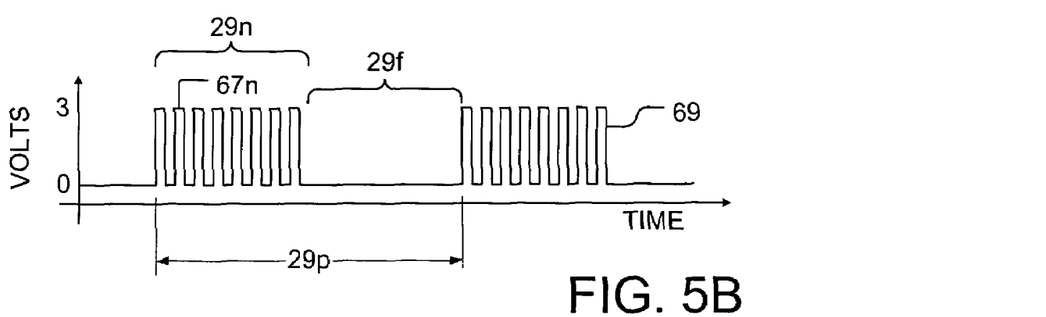
Figure 5C:
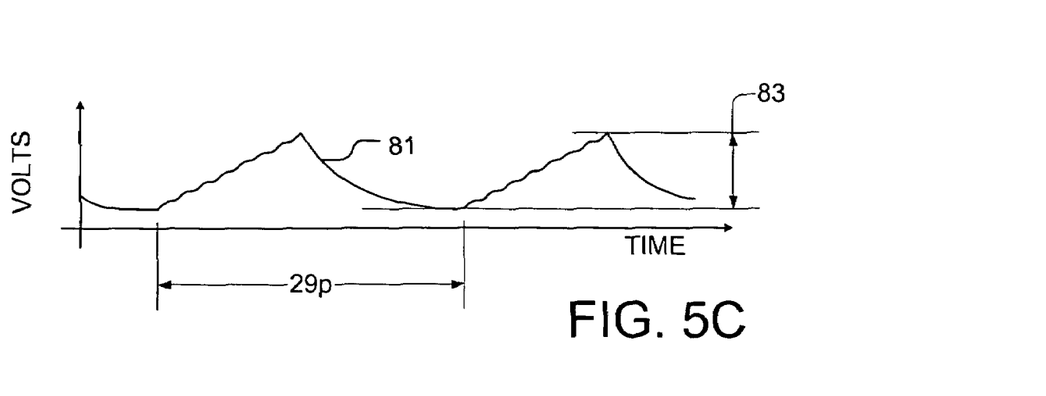

Next, referring to FIGS. 2B and 3, the audio frequency square-wave signal 29 is modulated with the modulation signal 67. FIGS. 5A through 5C illustrate the modulation and filtering process. Referring to FIGS. 2B, 3, and 5A through 5C, the audio frequency square-wave signal generator 22 and the comparator 66 are connected to an AND logic gate 68. The AND gate 68 performs a logical AND operation on its two input signals—here, its two input signals are the audio frequency square-wave signal 29 illustrated in FIG. 3 and modulation signal 67. For example, the half-duty modulation signal 67b of FIG. 4B is reproduced in FIG. 5A having a time scale matching that of FIG. 3. Only one of these pulses 67n is thus labeled in FIG. 5A to avoid clutter. For the sample audio frequency of two KHz, the audio frequency period 29p is 0.5 milliseconds (ms). For each audio frequency period 29p of 0.5 ms, 16 pulses of the modulation signal 67 are coincident.

The AND gate 68 modulates the audio frequency square-wave signal 29 with the modulation signal 67b (in the illustrated example) to produce a modulated audio frequency square-wave signal 69 illustrated in FIG. 5B. The AND gate operates such that, at any one time, the modulated audio frequency square-wave signal 69 is on only when both the audio frequency square-wave signal 29 and the modulation signal 67b are on.

Accordingly, during the "on" portions 29n of the audio frequency square-wave signal 29, a plurality of pulses 67n (from the modulation signal 67) are produced in the modulated audio frequency square-wave signal 69. Conversely, the during the "off" portions 29f of the audio frequency square-wave signal 29 the modulated audio frequency square-wave signal 69 is also "off." For the illustrated example, during each of the "on" portions 29n of the audio frequency square-wave signal 29, eight pulses 67n from the modulation signal 67b are coincident. Only one of these pulses 67n is thus labeled in FIG. 5B to avoid clutter.

Again, for convenience, the same reference number 69 is used to refer to output pin 69 of the AND gate 68 as well as the modulated audio frequency square-wave signal 69 carried by the output pin 69.

The modulated audio frequency square-wave signal 69 leaves the ASIC 60 via a single output pin 69 to the amplifier subsystem 80. At the amplifier subsystem 80, the modulated audio frequency square-wave signal 69 is filtered by a resistor-capacitor (RC) filter 32 to minimize or remove higher order (higher than the fundamental audio frequency) frequency components resulting in a filtered audio signal 81 illustrated in FIG. 5C. The filtered audio signal 81 is then amplified by an amplifier 82, which, with the amplified signal, is connected to and drives the speaker 14 to produce the sound. In the present example, the amplifier 82 can be a simple fixed gain amplifier similar or even identical in design to the fixed gain amplifier 36 of FIG. 1B.

The filtered audio signal 81 has an audio frequency period 29p that is same as the audio frequency period 29p of the audio frequency square-wave signal 29 generated by the audio square-wave signal generator 22. The filtered audio signal 81 has amplitude 83 that depends on the width of the pulses 67n that constitute the modulated audio frequency square-wave signal 69. This is because the RC filter 32 operates to integrate, or sum, the power of each of the pulses. This is known in the art. Further, the amplitude 83 determines the volume of the sound produced at the speaker 14.

Consequently, the volume of the sound at the speaker 14 can be controlled by controlling the pulse width of the modulation signal 67. The pulse width of the modulation signal 67, in turn, can be controlled by the volume control value set at the register 64.

Figure 6A:
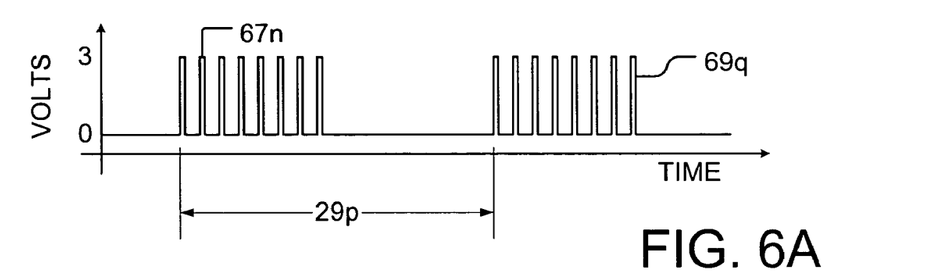
Figure 6B:
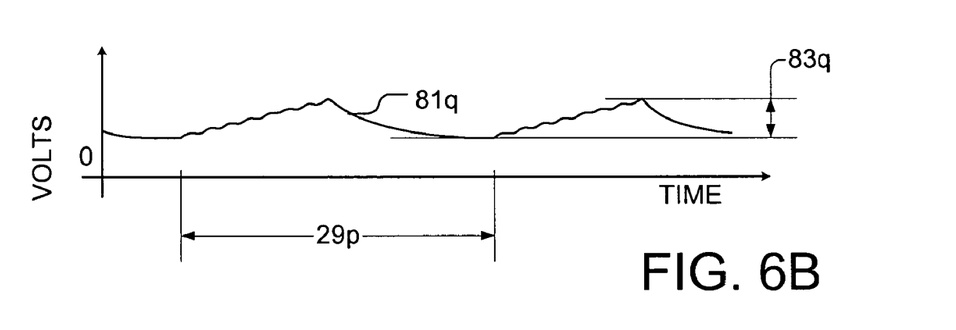

For the embodiment of the present example, if the volume control value is set at eight, then, the modulation signal 67 includes pulses having 25 percent duty cycle as discussed above and illustrated in FIG. 4A as the quarter-duty modulation signal 67a. When the audio frequency square-wave signal 29 of FIG. 3 is modulated by the quarter-duty modulation signal 67a of FIG. 4A, the resulting modulated audio frequency square-wave signal 69 includes pulses 67n having 25 percent duty cycle as illustrated as modulated audio frequency square-wave signal 69q of FIG. 6A. Here, the pulses 67n are narrower than the pulses 67n of the half-duty modulation signal 67b of FIGS. 4B, 5A, and 5B. When the modulated audio frequency square-wave signal 69q is filtered by the RC filter 32 of FIG. 2B, resulting filtered audio signal 81q of FIG. 6B has smaller amplitude 83q compared to the amplitude 83 of FIG. 5C. The smaller amplitude 83q results in lower volume of the sound produced at the speaker 14 of FIG. 3.

Figure 7A:
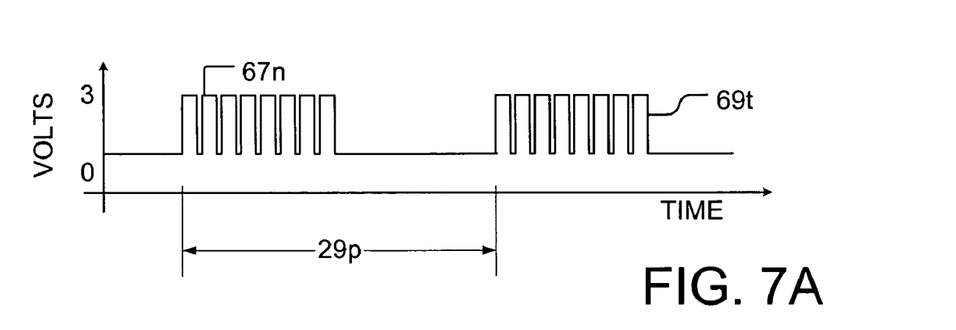
Figure 7B:
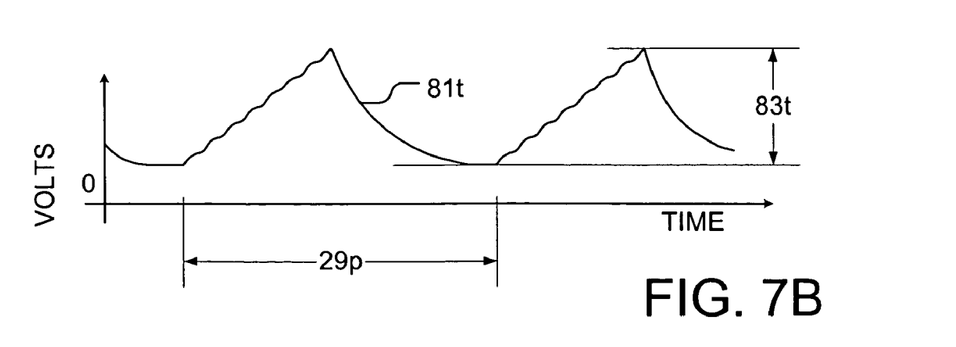

Alternatively, for the embodiment of the present example, if the volume control value is set at 24, then, the modulation signal 67 includes pulses having 75 percent duty cycle as discussed above and illustrated in FIG. 4C as the three-quarter-duty modulation signal 67c. When the audio frequency square-wave signal 29 of FIG. 3 is modulated by the three-quarter-duty modulation signal 67c of FIG. 4C, the resulting modulated audio frequency square-wave signal 69 includes pulses 67n having 75 percent duty cycle as illustrated as modulated audio frequency square-wave signal 69t of FIG. 7A. Here, the pulses 67n are wider than the pulses 67n of the half-duty modulation signal 67b of FIGS. 4B, 5A, and 5B. When the modulated audio frequency square-wave signal 69t is filtered by the RC filter 32 of FIG. 2B, resulting filtered audio signal 81t of FIG. 7B has larger amplitude 83t compared to the amplitude 83 of FIG. 5C. The larger amplitude 83t results in greater volume of the sound produced at the speaker 14 of FIG. 3.

Referring again to FIG. 2B, the ASIC 60 can also include an enable switch 70 connected to the AND gate 68 to send enable signal 71 to the AND gate 68. The enable signal 71 can be used to disable, or turn off, the AND gate thereby preventing generation of any sound at the speaker 14. Alternatively, the register 64 can be set to zero value to cause the AND gate to produce a flat modulated audio frequency square-wave signal 69 to prevent generation of sounds by the speaker 14.

From the foregoing, it will be appreciated that the present invention is novel and offers advantages over the current art. Although a specific embodiment of the invention is described and illustrated above, the invention is not to be limited to the specific forms or arrangements of parts so described and illustrated. The invention is limited by the claims that follow. Only those claims specifically reciting "means for" or "step for" should be construed in the manner required under the sixth paragraph of 35 U.S.C. section 112.

What is claimed is:

1. An integrated circuit (IC) chip comprising:
    a square-wave audio signal generator adapted to generate square-wave signal at an audio frequency;
    a counter adapted to digitally count from zero to a predetermined number;
    a register adapted to hold a volume control value;
    a comparator connected to said counter and connected to said register, said comparator adapted to compare a present count from the counter with the volume control value to produce a modulation signal; and
    an AND gate, operable in accordance with a switch, said AND gate connected to said square-wave signal generator and connected to said comparator, said AND gate adapted to combine, in a logical AND operation, the square-wave signal with the modulation signal to generate a modulated square-wave signal that is on, when both the square-wave signal and the modulation signal are on, and off when one or both of the square-wave signal and the modulation signal are off, the output signal from the AND gate coupled directly to a single pin of the IC, the single pin being the only volume control coupled to an amplifier subsystem and the only pin needed to send said modulated square-wave signal and the volume control signal to the amplifier subsystem.

2. The IC recited in claim 1 wherein said square-wave audio signal generator generates a square-wave audio signal generator having a frequency within a range from 500 Hz to five KHz.

3. The IC recited in claim 1 wherein said counter is a 5-bit counter adapted to count from 0 to 31.

4. The IC recited in claim 1 wherein said counter operates at a counter frequency on the order of MHz.

5. The IC recited in claim 1 wherein said register is a pulse width register having five bits.

6. The IC recited in claim 1 wherein the integrated circuit chip is an application specific integrated circuit chip (ASIC).

7. A method of generating modulated square-wave audio signal, the method comprising:
    generating a square-wave audio signal having a first audio frequency;
    repeatedly counting a predetermined range of values generating count signals;
    modulating the count signal with a volume control signal resulting in a modulation signal;
    modulating the square-wave signal with the modulation signal to generate a modulated square-wave signal that is on when both the square-wave signal and the modulation signal are on and off when one or both of the square-wave signal and the modulation signal are off; and
    applying the modulated square-wave signal via a single conductor, the single conductor being the only volume control interface between an integrated circuit and an amplifier system and the only conductor needed to send the modulated square-wave signal and the volume control signal to the amplifier subsystem.

8. The method recited in claim 7 wherein the first audio frequency is within a range from 500 Hz to five KHz.

9. The method recited in claim 7 wherein the digital counting step counts from 0 to 31.

10. The method recited in claim 7 wherein the digital counting step operates a counter frequency on the order of MHz.

11. The method recited in claim 7 wherein the volume control signal is set at a value within a range counted by the repeatedly counting step.

12. An apparatus comprising:
    an integrated circuit (IC) adapted to generate a modulated square-wave signal;
    an amplifier subsystem connected to said IC via only a single pin associated with each of the IC and the amplifier subsystem, respectively, the amplifier subsystem adapted to filter and amplify the modulated square-wave signal, and said single pin being the only volume control and the only pin needed to send said modulated square-wave signal and the volume control signal to the amplifier subsystem, wherein said IC comprises:

a square-wave signal generator adapted to generate a square-wave signal at an audio frequency;

a counter adapted to digitally count from zero to a predetermined number;

a register adapted to hold a volume control value;

a comparator connected to said counter and connected to said register, said comparator adapted to compare a present count from the counter with the volume control value to produce a modulation signal; and an AND gate, operable in accordance with a switch, said AND gate connected to said square-wave signal generator and connected to said comparator, said AND gate adapted to combine, in a logical AND operation, the square-wave signal with the modulation signal to generate a modulated output signal that is on, when both the square wave signal and the modulation signal are on, and off when one or both of the square-wave signal and the modulation signal are off.

13. The apparatus recited in claim 12 wherein said square-wave audio signal generator generates a square-wave audio signal generator having a frequency within a range from 500 Hz to five KHz.

14. The apparatus recited in claim 12 wherein said counter is a 5-bit counter adapted to count from 0 to 31.

15. The apparatus recited in claim 12 wherein said counter operates at a counter frequency on the order of MHz.

16. The apparatus recited in claim 12 wherein said register is a pulse width register having five bits.

17. The apparatus recited in claim 12 wherein said amplifier subsystem comprises a resistor-capacitor (RC) filter connected to a fixed gain amplifier.

* * * * *

UNITED STATES PATENT AND TRADEMARK OFFICE
CERTIFICATE OF CORRECTION

PATENT NO.         : 7,424,120 B2                                         Page 1 of 1
APPLICATION NO.    : 10/635073
DATED              : September 9, 2008
INVENTOR(S)        : Douglas Gene Keithley It is certified that error appears in the above-identified patent and that said Letters Patent is hereby corrected as shown below:

On the title page, item [57]: Column 2, (Abstract), Line 5, delete "Theses" and insert -- These --;

Column 8, Line 17, Claim 2, delete "generator having" and insert -- having --;

Column 8, Line 27, Claim 7, delete "generating modulated" and insert -- generating a modulated --;

Column 8, line 34 (Approx.), Claim 7, delete "signal" and insert -- signals --;

Column 8, Line 49, Claim 9, delete "digital" and insert -- repeatedly --;

Column 8, Line 51, Claim 10, delete "digital" and insert -- repeatedly --;

Column 8, Line 52, Claim 10, delete "a" and insert -- at a --;

Column 10, Line 2, Claim 13, delete "audio signal" and insert -- signal --;

Column 10, Line 2-3, Claim 13, delete "audio signal" and insert -- signal --;

Column 10, Line 3, Claim 13, delete "generator having" and insert -- having --.

Signed and Sealed this

Tenth Day of August, 2010

David J. Kappos
*Director of the United States Patent and Trademark Office*